United States Patent [19]
Hong

[11] Patent Number: 5,556,799
[45] Date of Patent: Sep. 17, 1996

[54] PROCESS FOR FABRICATING A FLASH EEPROM

[75] Inventor: Gary Hong, Hsinchu, Taiwan

[73] Assignee: United Microelectronics Corporation, Hsinchu, Taiwan

[21] Appl. No.: 558,957

[22] Filed: Nov. 13, 1995

[51] Int. Cl.$^6$ .............................................. H01L 21/8247
[52] U.S. Cl. ................................ 437/43; 437/69; 257/316
[58] Field of Search ................................. 437/43, 48, 52, 437/69; 257/316

[56] References Cited

U.S. PATENT DOCUMENTS

| | | | |
|---|---|---|---|
| 5,196,361 | 3/1993 | Ong et al. | 437/43 |
| 5,208,175 | 5/1993 | Choi et al. | 437/43 |
| 5,498,556 | 3/1996 | Hong et al. | 437/35 |
| 5,498,891 | 3/1996 | Sato | 257/316 |
| 5,502,321 | 3/1996 | Matsushita | 257/316 |

*Primary Examiner*—Mary Wilczewski
*Assistant Examiner*—Richard A. Booth
*Attorney, Agent, or Firm*—Ladas & Parry

[57] ABSTRACT

A process for fabricating a flash EEPROM device in a semiconductor substrate. The flash EEPROM device includes a number of memory cells each built around a transistor. A shielding layer is first formed over the surface of the substrate extending in a first direction for defining bit lines for the memory cells of the device. The shielding layer is then utilized as a shielding mask for implementing an oxidation procedure, thereby forming field oxide layers over the surface of the substrate of the first conductivity type, whereby the shielding layer straddles the field oxide layers. Then the field oxide layers are utilized as the shielding mask for implanting impurities into the substrate, thereby forming the bit lines. The shielding layers then are utilized as the shielding mask for removing the field oxide layers while preserving the portions of the field oxide layer underneath the shielding layers, thereby forming trenches revealing the substrate. The shielding layers are then removed. An oxidation procedure is implemented for forming tunnel oxide layers in the trenches, an oxidation procedure further forming insulating layers over the bit lines. Floating gates are then formed over the surface of the tunnel oxide layers and the field oxide layers. An inter-gate dielectric layer is then formed over the floating gates. Finally, control gates for the device are formed over the inter-gate dielectric layers. The resulting floating gates have increased surface area, thus directly improving the coupling ratio.

5 Claims, 6 Drawing Sheets

PROCESS FOR FABRICATING A FLASH EEPROM

BACKGROUND OF THE INVENTION

1. Field of the Invention

The present invention relates in general to a process for fabricating flash electrically erasable and programmable read-only memory (flash EEPROM) devices. In particular, the present invention relates to a process for fabricating flash EEPROM devices having improved programing and accessing speed characteristics.

2. Technical Background

The flash EEPROM is one of the semiconductor memory devices that are enjoying the progress in device miniaturization brought about by the sustained advancements in the semiconductor fabrication technology. However, as component dimensions continue to shrink, the surface area of the floating gate in the memory cell transistor is also being reduced, which results in the degradation of the coupling ratio for the applied voltage at the control gate of the memory cell transistor. The direct effect is the limitation, even degradation, of the speed characteristics of memory cell programming and accessing operations.

A brief description of a conventional flash EEPROM device is included below to assist in the understanding of the present invention. FIG. 1 schematically shows the top view of the memory cells of a conventional flash EEPROM device. FIG. 2 schematically shows a cross-sectional view of the memory cells of the conventional flash EEPROM device of FIG. 1 as taken along the II—II line. A simultaneous reference to the two drawings will help explain the flash EEPROM device of the prior art.

As is seen in FIGS. 1 and 2, P-type silicon substrate 10 is utilized as the basis for the construction of the flash EEPROM device. $N^+$ type buried bit lines 100 are formed within P-type silicon substrate 10, those of which surrounded by $N^-$ doped region 102 that serves as the source region for a memory cell transistor of the flash EEPROM device. Tunnel oxide layers 110 are formed over the surface of P-type substrate 10, and are covered by floating gates 120. Inter-gate dielectric layers 130 are further formed over floating gates 120, with control gates 140 formed further on top that serve as the word lines for the flash EEPROM device.

However, as flash EEPROM devices are fabricated in ever finer resolutions, the surface area of floating gates 120 also shrinks. This leads directly to a decrease in capacitance of the effective capacitor formed between the layer of floating gate 120 and the layer of control gate 140. This decrease in effective capacitance results in a reduction of the coupling ratio, which is a parameter that describes the coupling to floating gate 120 of the voltage applied to control gate 140. The poorly-coupled voltage to floating gate 120 limits the programming and accessing speed characteristics of the flash EEPROM device.

SUMMARY OF THE INVENTION

It is therefore an object of the present invention to provide a process for fabricating a flash EEPROM device that allows for an improved coupling ratio for the floating gate voltage to sustain high device programming and accessing speed.

The present invention achieves the above-identified objects by providing an innovative process for fabricating a flash EEPROM device on a semiconductor substrate. The flash EEPROM device includes a number of memory cells each built around a transistor. A shielding layer is first formed over the surface of the substrate extending in a first direction for defining bit lines for the memory cells of the device. The shielding layer is then utilized as a shielding mask for implementing an oxidation procedure, thereby forming field oxide layers over the surface of the substrate of the first conductivity type, whereby the shielding layer straddles the field oxide layers. Then the field oxide layers are utilized as the shielding mask for implanting impurities into the substrate, thereby forming the bit lines. The shielding layers then are utilized as the shielding mask for removing the field oxide layers while preserving the portions of the field oxide layer underneath the shielding layers, thereby forming trenches revealing the substrate. The shielding layers are then removed. An oxidation procedure is implemented for forming tunnel oxide layers in the trenches, an oxidation procedure further forming insulating layers over the bit lines. Floating gates are then formed over the surface of the tunnel oxide layers and the field oxide layers. An inter-gate dielectric layer is then formed over the floating gates. Finally, control gates for the device are formed over the inter-gate dielectric layers. The resulting floating gates have increased surface area, thus directly improving the coupling ratio.

Other objects, features, and advantages of the present invention will become apparent by way of the following detailed description of the preferred but non-limiting embodiment.

BRIEF DESCRIPTION OF THE DRAWINGS

The detailed description of the preferred embodiment of the invention is made with reference to the accompanying drawings in which.

DETAILED DESCRIPTION OF THE PREFERRED EMBODIMENT

Figure 1:
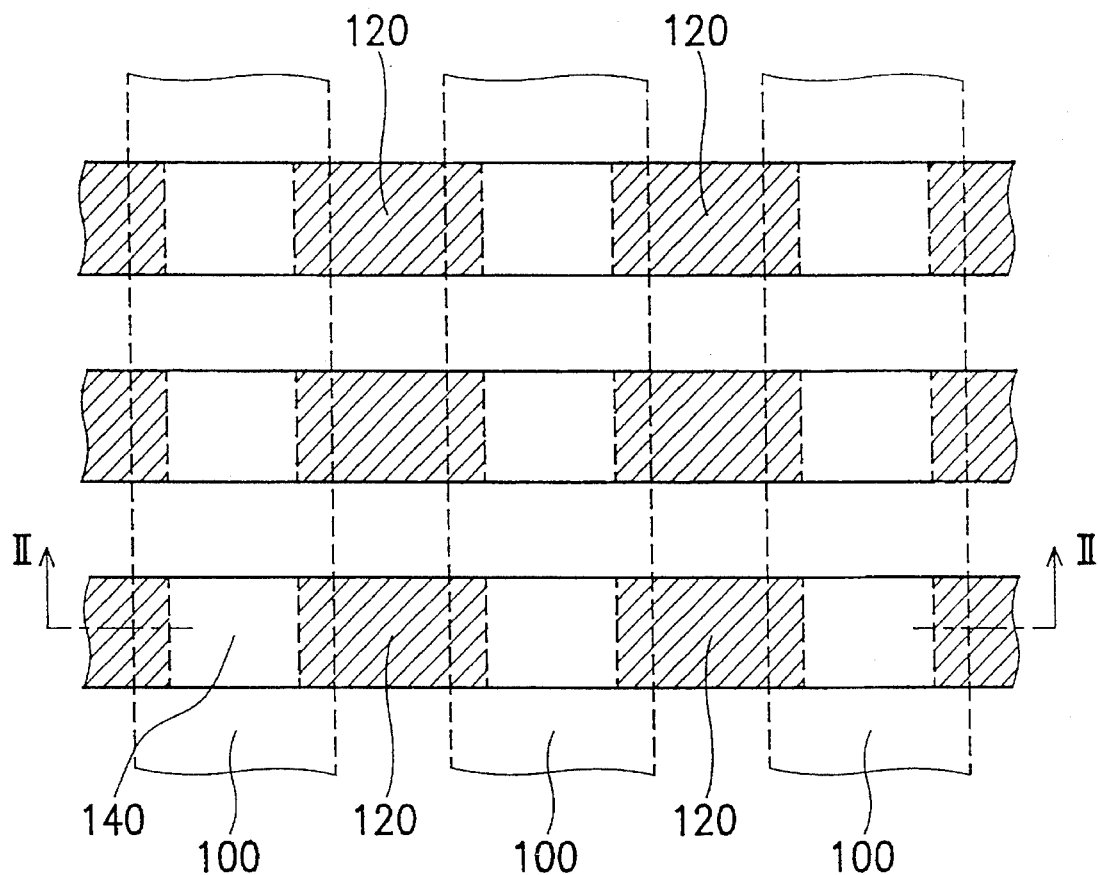
FIG. 1 schematically shows the top view of the memory cells of a conventional flash EEPROM device.
Figure 2:
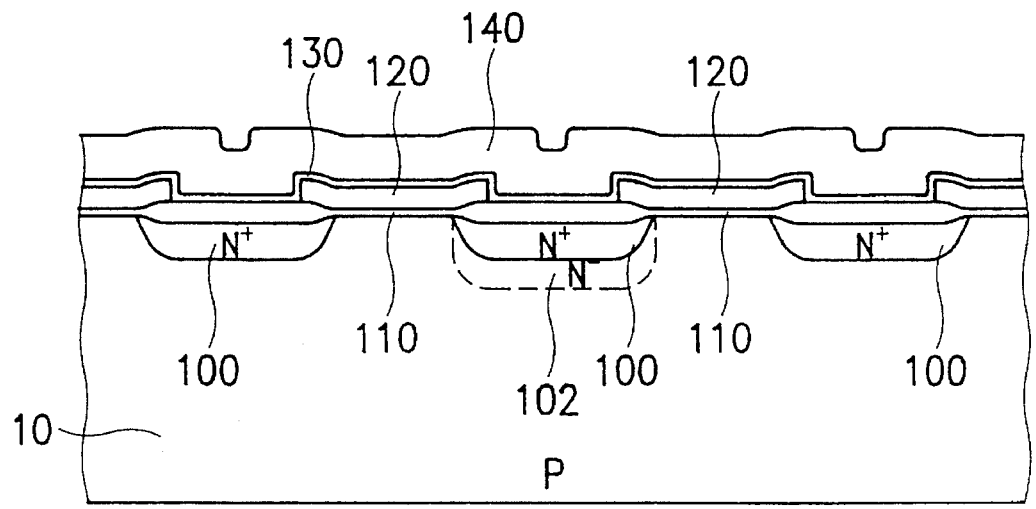
FIG. 2 schematically shows the cross-sectional view of the memory cell of the conventional flash EEPROM device of FIG. 1 as taken along the II—II line thereof.
Figure 3:
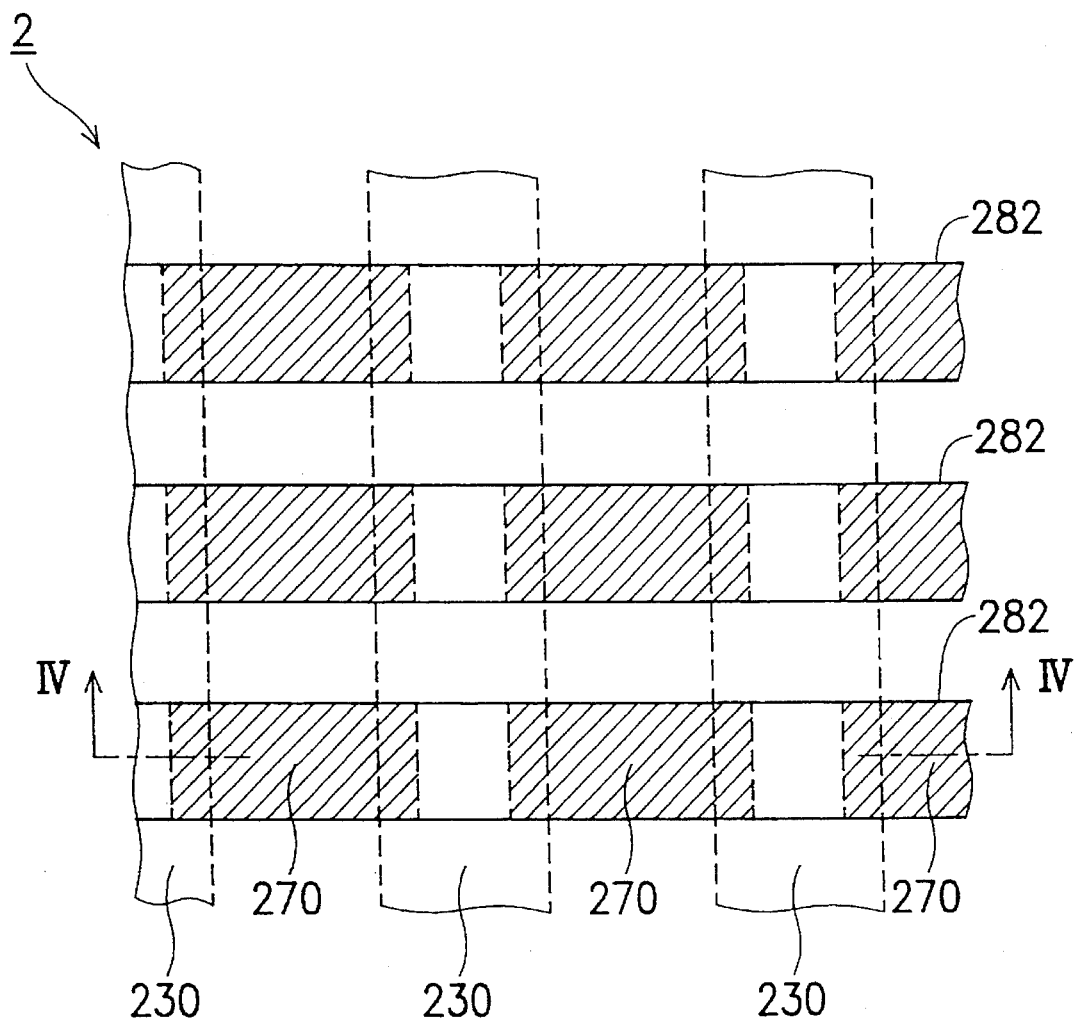
FIG. 3 schematically shows the top view of the memory cells of the flash EEPROM device fabricated in accordance with a preferred embodiment of the present invention.

For a detailed description of the present invention, a preferred embodiment of the process for fabricating flash EEPROM devices with improved programming and accessing speed characteristics is described below. FIG. 3 schematically shows the top view of the memory cells of the flash EEPROM device fabricated in accordance with a preferred embodiment of the present invention. FIGS. 4a–4h schematically show the cross-sectional views of the memory cell of the flash EEPROM device of FIG. 3 taken along the IV—IV line thereof as depicted from the process stages of its fabrication. During the course of the description of the preferred embodiment of the present invention, reference should be made to the top view of FIG. 3 for a threedimensional concept of the structural configuration of the memory cell transistors for the flash EEPROM device.

In the described embodiment, P-type semiconductor silicon substrate 20 is employed as the basis for the construction of the flash EEPROM device of the present invention, although N-type substrate would be equally applicable. The use of P-type substrate 20 is only for a description of the present invention, not for the limitation to the scope of the present invention. The process of fabrication is described in the following steps:

Stage 1

Figure 4A:
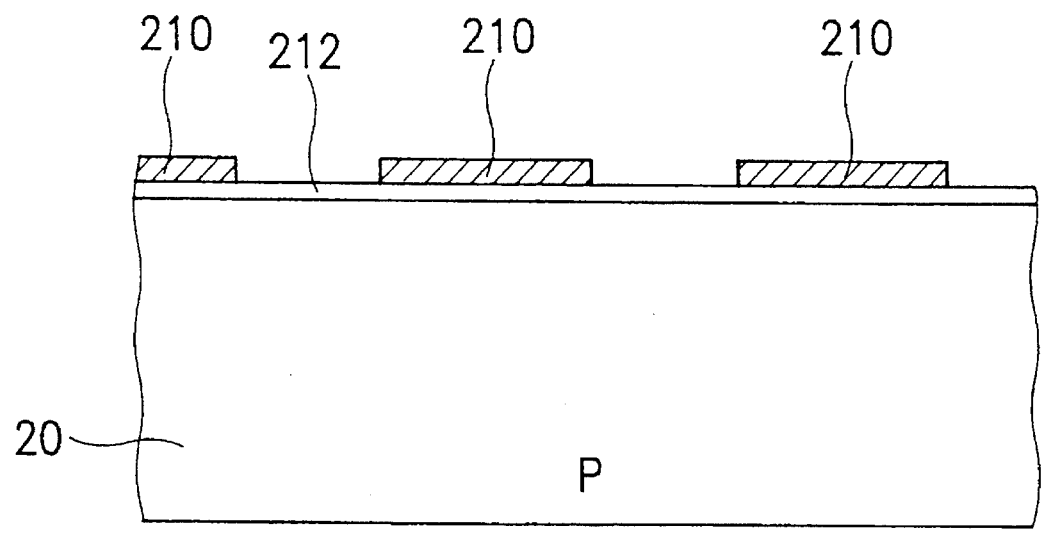
FIGS. 4a–4h schematically show the cross-sectional views of the memory cell of the flash EEPROM device of FIG. 3 taken along the IV—IV line thereof as depicted from the process stages of its fabrication.

Referring to FIG. 4a, simultaneously with FIG. 3, substrate 20 of a first conductivity type (e.g., in this embodiment, P-type) is employed as the basis for fabricated flash EEPROM device 2 of the present invention. As is seen in FIG. 4a, shielding layers 210 are formed over the surface of substrate 20 along a first direction, such as the vertical direction with reference to the top view of FIG. 3. Shielding layers 210 are utilized to define bit lines 230 for the flash EEPROM device. This can be done by, for example, performing a thermal oxidation procedure to grow pad oxide layer 212 over the surface of substrate 20, followed by a deposition of a nitride layer over the surface of pad oxide layer 212. The thickness of the deposited nitride layer is in the range of, for example, about 600–1,000 Å. A photolithography procedure is then performed to etch the designated portions of the deposited nitride layer so as the form shielding layers 210 into the shape as depicted in the cross-sectional view of FIG. 4a.

Stage 2

Figure 4B:
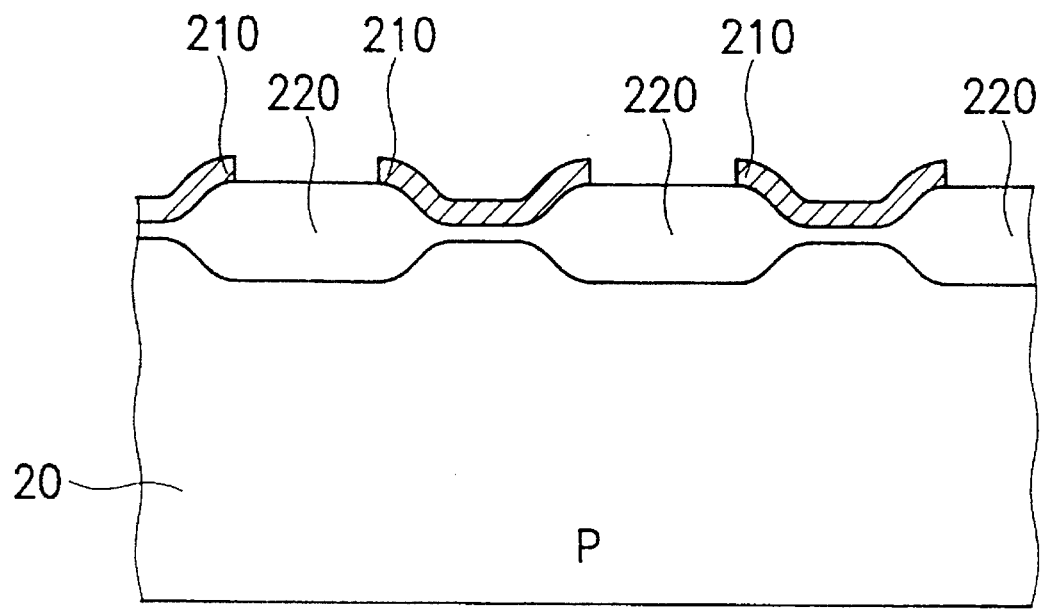

Referring next to FIG. 4b, shielding layer 210 formed in the previous stage is utilized as the shielding mask for the implementation of an oxidation procedure. The oxidation procedure forms field oxide layers 220 over the surface of substrate 20 as controlled by the pattern defined in shielding layer 210. This oxidation procedure leaves shielding layers 210 straddling field oxide layers 220, as is seen in FIG. 4b.

This can be done by, for example, performing a LOCOS (local oxidation of silicon) procedure for selective oxidation to form field oxide layer 220 to a thickness of, for example, about 5,000 Å.

Stage 3

Figure 4C:
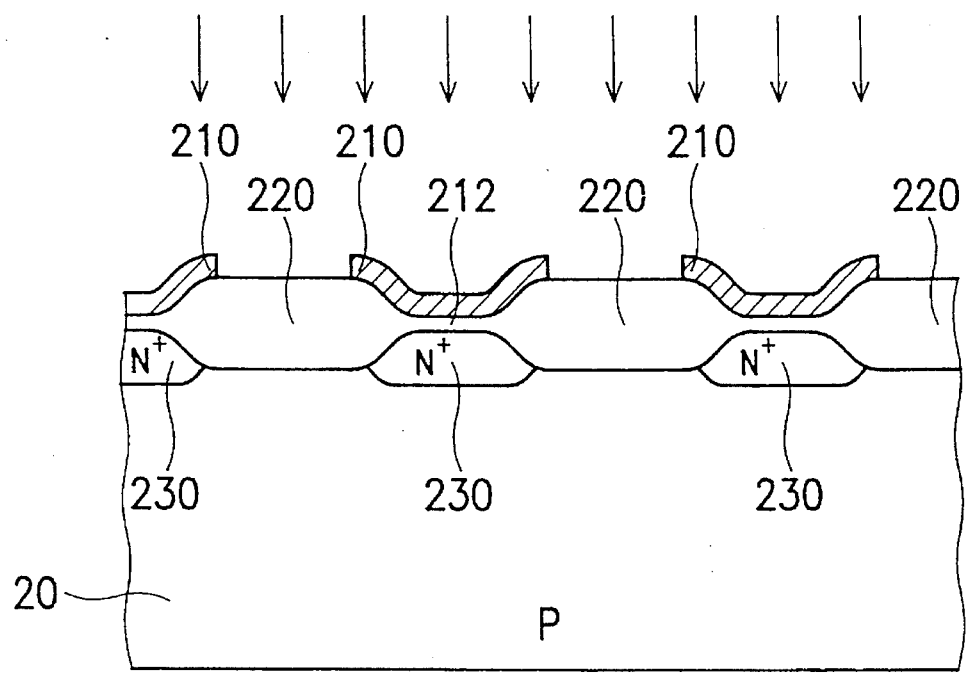
Figure 4D:
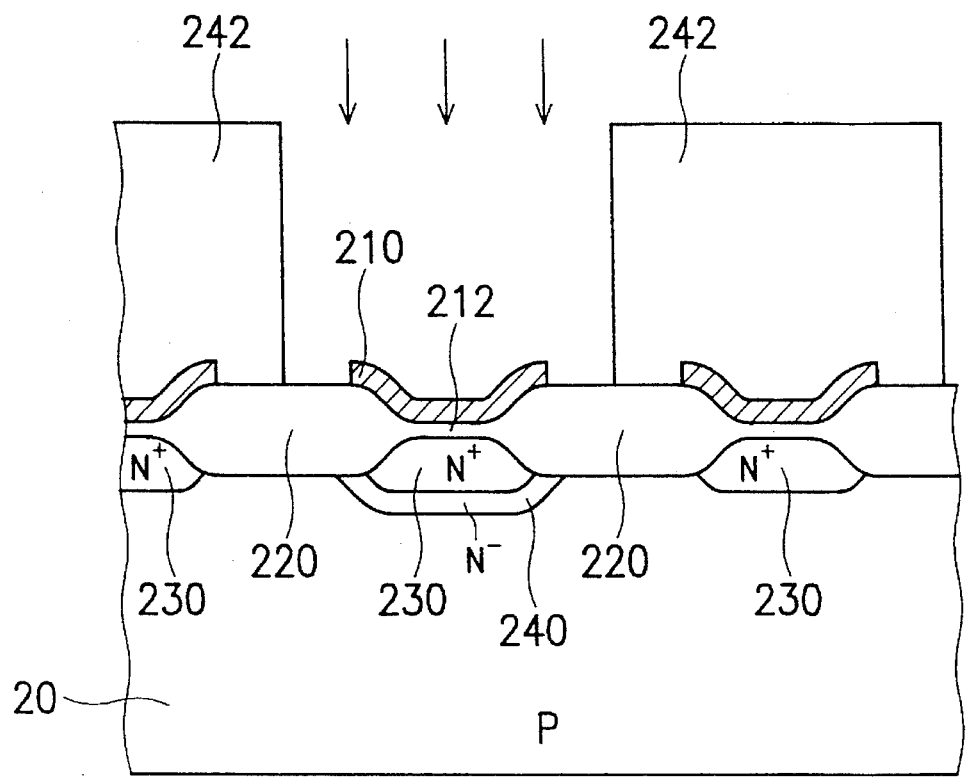

Then, as is seen in FIG. 4c, field oxide layers 220 are utilized as the shielding mask for the implementation of an ion implantation procedure. The procedure implants impurities of a second conductivity type (e.g., in this embodiment N-type) through shielding layer 210 into substrate 20 in the regions beneath the shielding layers 210, as is shown in the cross-sectional view of FIG. 4c. This forms bit lines 230. The ion implantation procedure is an inherently self-aligned process. This can be achieved by, for example, implanting arsenic (As) ions at an implantation energy level of about 100 KeV, with an achieved concentration of about 5×1015 atoms/cm², forming the N$^+$ doped region which provide bit lines 230. As is seen in FIG. 4d, photoresist layer 242 may be formed in a photolithography procedure which can be utilized as the shielding mask for an implantation procedure. The procedure implants phosphorus (P) ions at an energy level of about 60 KeV, with an achieved impurity concentration of about 1×1014 atoms/cm². This creates N$^-$ doped region 240 surrounding one N$^+$ doped region which is utilized as the source region for the memory cell transistor. Other N$^+$ doped regions 230 not surrounded by N$^-$ doped region 240 serves as the drain region of the memory cell transistor. The energy level for the implantation procedure should be selected to allow for the impurity ions to be able to penetrate through shielding layers 210, as well as pad oxide layers 212, while not overly excessive to pass through field oxide layers 220. Photoresist layer 242 may then be removed.

Stage 4

Figure 4E:
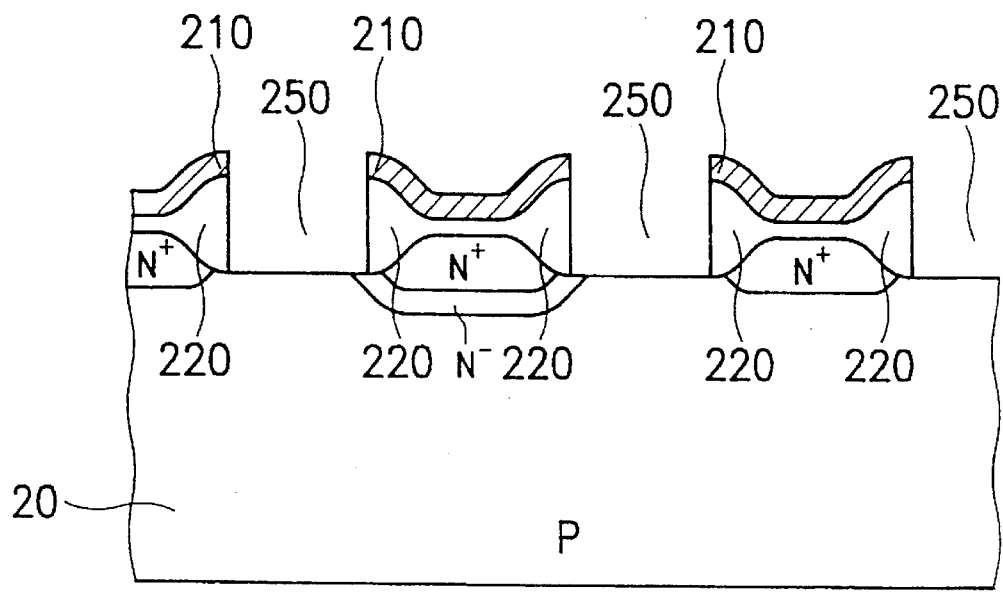

Then, as shown in FIG. 4e, shielding layers 210 are again utilized as a shielding mask for a process to remove part of field oxide layers 220. Portions of field oxide layers 220 underneath the shielding layers 210 are preserved, thereby forming trenches 250 that each reveal substrate 20. This can be done by, for example, performing an anisotropic etching procedure, so as to remove the exposed portions of field oxide layers 220 not covered by shielding layers 210. Shielding layer 210 may then be removed.

Stage 5

Figure 4F:
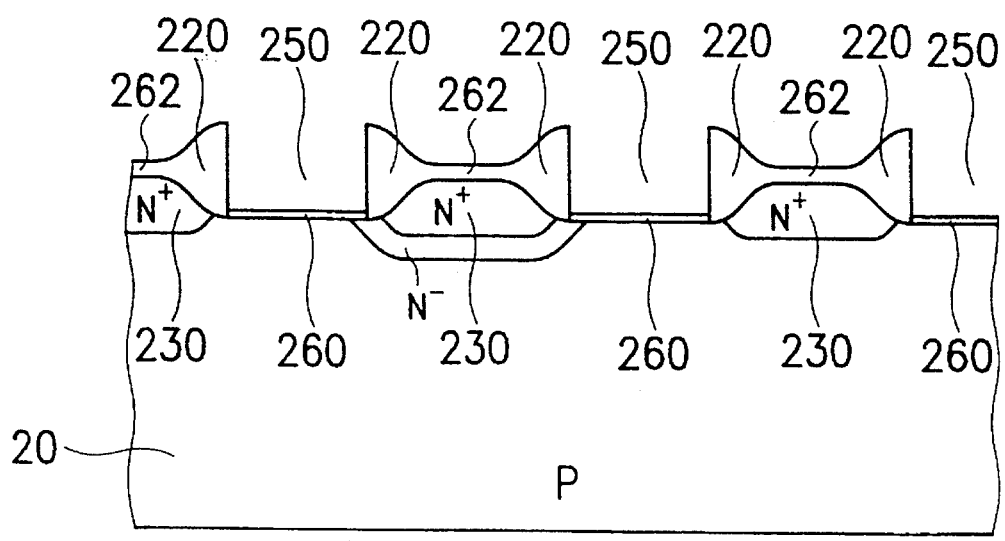

Next, as is shown in FIG. 4f, an oxidation procedure is performed to form tunnel oxide layers 260 over the surface of substrate 20 inside trenches 250. The thickness of formed tunnel oxide layers 260 is about, for example, 60–100 Å. Meanwhile, pad oxide layer 212 are also grown a few to form insulating oxide layers 262 over the surface of bit lines 230, as can be observed in the drawing.

Stage 6

Figure 4G:
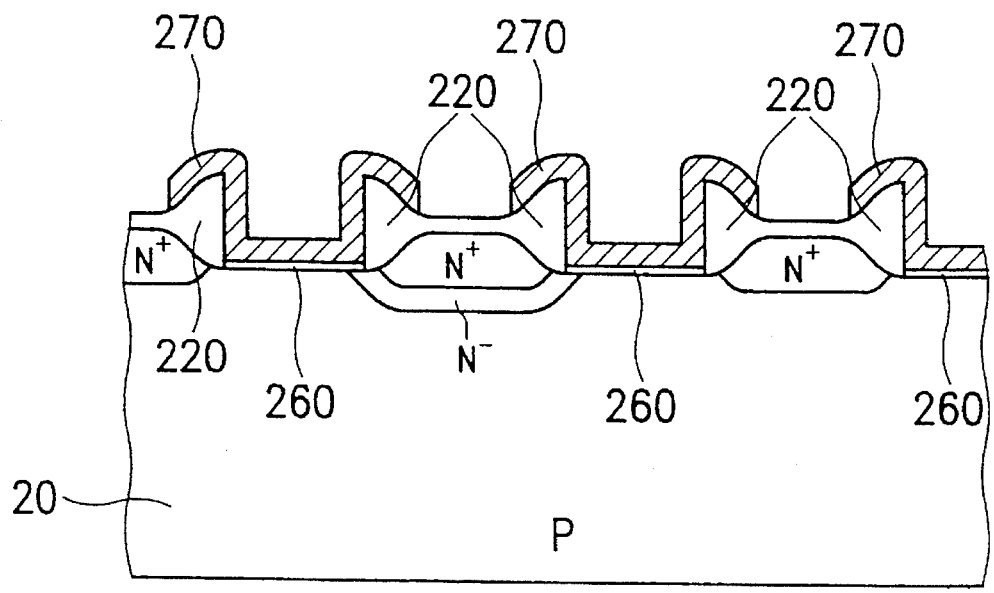

Then, as can be observed in FIG. 4g, trench-like floating gates 270 are formed over the surface of tunnel oxide layer 260 as well as field oxide layers 220. This can be achieved by, for example, first depositing a polysilicon layer to a thickness of, for example, about 1,000 Å which can then be etched in a photolithography procedure to form floating gates 270 with the desired patterns. The Stage 7

Figure 4H:
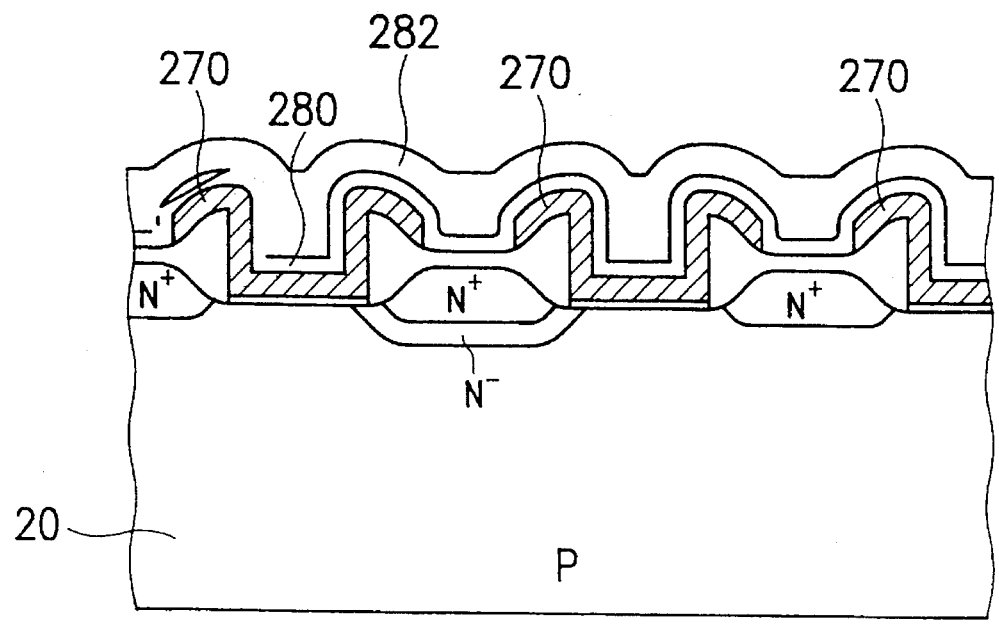

Finally, as is shown in FIG. 4h, inter-gate dielectric layers 280 are then formed over floating gates 270 and insulating oxide layers 262. Then, control gates 282 are formed over inter-gate dielectric layers 280 that generally extend in a second direction over the surface of the substrate 20. The second direction forms an angle with the first direction described above. Control gates 282 are utilized as the word lines for the memory cell transistors of the flash EEPROM device as fabricated. This can be achieved by, for example, forming the oxide-nitride-oxide (ONO) layers as inter-gate dielectric layers 280, followed by the deposition of a polysilicon layer that is etched into shape to form control gates 282 in a photolithography procedure. The second direction of dielectric layers 280 may be, for example, the horizontal direction as observed in FIG. 3.

This generally concludes the process for fabricating the memory cells for the flash EEPROM device of the present invention. Because trenches are formed in the field oxide layer, floating gates formed over the surface of both the trenches and the field oxide layers are also trench-like and, therefore, the surface area of the floating gate is significantly increased. As may be readily appreciated by persons skilled in this art, this increased surface area of the floating gate provides an increase in the effective capacitance between the control gate and the floating gate layer for each of the memory cell transistors. As a result, the voltage coupling ratio therebetween is improved and the programming and accessing speed characteristics of the memory cells of the fabricated flash EEPROM device is significantly enhanced.

Thus, the process of fabricating the flash EEPROM device having an increased coupling ratio parameter as disclosed by the present invention is advantageous for improving the programming and accessing speed characteristics of the device. Although specific embodiments are exemplified in the descriptive paragraphs outlined above, persons skilled in the art can, however, appreciate the fact that many modifications to the embodiments as disclosed would still fall within the scope of the present invention, which is recited in the claims that follow.

What is claimed is:

1. A process for fabricating a flash EEPROM device on a semiconductor substrate of a first conductivity type, comprising the steps of:

forming a shielding layer with designated patterns over a surface of said semiconductor substrate, said designated patterns extending in a first direction;

forming field oxide layers among said shielding layer, wherein said field oxide layers encroach beneath side edges of said shielding layer;

forming regions of a second conductivity type in said semiconductor substrate underlying said shielding layer, said regions constituting a plurality of bit lines of said flash EEPROM device;

removing a portion of said field oxide layers not covered by said shielding layer to form trenches and provide an exposed semiconductor substrate;

removing said shielding layer;

forming tunnel oxide layers on said exposed semiconductor substrate;

forming floating gates over said tunnel oxide layers and said field oxide layers;

forming an inter-gate dielectric layer over said floating gates; and forming control gates over said inter-gate dielectric layer, said control gates extending in a second direction and constituting a plurality of word lines for said flash EEPROM device.

2. The process for fabricating said flash EEPROM device of claim 1, wherein said bit lines are constituted by heavily-doped regions of second conductivity type that are drain regions, and said bit lines are constituted by lightly-doped regions of second conductivity type each surrounding said heavily-doped regions that are source regions.

3. The process for fabricating said flash EEPROM device of claim 1, wherein the step of forming a shielding layer includes the step of forming a shielding layer composed of oxide and nitride.

4. The process for fabricating said flash EEPROM device of claim 1, wherein said first direction is orthogonal to said second direction.

5. The process for fabricating said flash EEPROM device of claim 1, wherein said first conductivity type is P-type and said second conductivity type is N-type.

* * * * *